(12) United States Patent
Kadotani et al.

(10) Patent No.: US 7,205,706 B2
(45) Date of Patent: Apr. 17, 2007

(54) STACKED PIEZOELECTRIC ELEMENT, PRODUCTION METHOD THEREOF AND ELECTRICALLY CONDUCTING ADHESIVE

(75) Inventors: Shige Kadotani, Chita-gun (JP); Akio Iwase, Nishio (JP)

(73) Assignee: Denso Corporation, Kariya, Aichi-pref. (JP)

( * ) Notice: Subject to any disclaimer, the term of this patent is extended or adjusted under 35 U.S.C. 154(b) by 69 days.

(21) Appl. No.: 11/212,563

(22) Filed: Aug. 29, 2005

(65) Prior Publication Data
US 2006/0043841 A1    Mar. 2, 2006

(30) Foreign Application Priority Data
Aug. 30, 2004  (JP) .............................. 2004-250926

(51) Int. Cl.
*H01L 41/047* (2006.01)
*H02N 2/02* (2006.01)

(52) U.S. Cl. .................. 310/365; 310/328; 310/340; 310/366

(58) Field of Classification Search ............... 310/328, 310/340, 363–366
See application file for complete search history.

(56) References Cited

U.S. PATENT DOCUMENTS 5,406,164 A * 4/1995 Okawa et al. ............... 310/366

2001/0026114 A1 * 10/2001 Takao et al. ............... 310/364

FOREIGN PATENT DOCUMENTS

| JP | 2000-77733 | 3/2000 |
| JP | 2001-284668 | 10/2001 |

* cited by examiner

*Primary Examiner*—Darren Schuberg
*Assistant Examiner*—Derek Rosenau
(74) *Attorney, Agent, or Firm*—Nixon & Vanderhye P.C.

(57) ABSTRACT

An object of the present invention is to provide a stacked piezoelectric element with excellent reliability and durability, a production method thereof and an electrically conducting adhesive.

A stacked piezoelectric element comprising a ceramic stack obtained by alternately stacking a piezoelectric layer comprising a piezoelectric material and an internal electrode layer having electrical conductivity, and an electrically conducting adhesive layer provided to allow for electrical conduction to said internal electrode layer of the same polarity on the side surface of said ceramic stack, wherein said electrically conducting adhesive layer comprises a base resin having dispersed therein an electrically conducting filler and microparticles, and the boundary between said microparticle and said base resin is in a state that a void is formed at least in a part between those two members or in a state that when said base resin is elongated, a void can be formed between those two members.

21 Claims, 9 Drawing Sheets

STACKED PIEZOELECTRIC ELEMENT, PRODUCTION METHOD THEREOF AND ELECTRICALLY CONDUCTING ADHESIVE

This application is a new U.S. patent application that claims benefit of JP 2004-250926, filed 30 Aug. 2004, the entire contents of each of which are hereby incorporated by reference.

FIELD OF THE INVENTION

The present invention relates to a stacked piezoelectric element applied to, for example, a piezoelectric actuator and also relates to a production method thereof and an electrically conducting adhesive.

BACKGROUND OF THE INVENTION

A stacked piezoelectric element generally comprises a ceramic stack obtained by alternately stacking piezoelectric layers comprising a piezoelectric material and internal electrode layers having electrical conductivity, and this stacked piezoelectric element is constructed such that a pair of side surface electrodes electrically connected to respective side surfaces of the ceramic stack are provided, a pair of take-out electrodes are joined to respective side surface electrodes by using, for example, an electrically conducting adhesive containing a resin, and piezoelectric displacement is generated due to the driving voltage applied between the paired take-out electrodes electrically connected to respective side surface electrodes.

In such a stacked piezoelectric element, an electrically conducting adhesive having flexibility is used to cope with the displacement of the piezoelectric layer generated during driving but, as the stacked piezoelectric element is used for a long time at a high temperature, troubles such as cracking or separation occur in the electrically conducting adhesive due to displacement of the piezoelectric layer or thermal curing of the resin, and this gives rise to a problem that electrical conduction failure occurs. Therefore, a stacked piezoelectric element having excellent reliability and durability, and usable for a long period of time in a severe environment, is required.

In order to solve these problems, for example, Japanese Unexamined Patent Publication (Kokai) No. 2000-77733 discloses a method of forming a stress-relieving layer on the side surface of a ceramic stack and joining a take-out electrode to the side surface of the stress-relieving layer by using an electrically conducting adhesive containing a resin. However, the strength of the stress-relieving layer is low and therefore, cracks readily occur in the stress-relieving layer. Also, the joined portion between the stress-relieving layer and the take-out electrode is insufficient in adhesion and readily causes separation.

Japanese Unexamined Patent Publication (Kokai) No. 2001-284668 discloses a method of processing an insulating groove in the end part of the internal electrode layer, filling an insulating resin therein, and joining a take-out electrode to the side surface of the ceramic stack by using an electrically conducting adhesive containing a heat-curable resin. However, in this method, similarly to the above, troubles such as cracking or separation occur due to thermal curing or the like of the resin.

The present invention has been made by taking account of problems in conventional techniques, and an object of the present invention is to provide a stacked piezoelectric element with excellent reliability and durability, a production method thereof and an electrically conducting adhesive.

SUMMARY OF THE INVENTION

A first aspect of the invention is a stacked piezoelectric element comprising a ceramic stack obtained by alternately stacking piezoelectric layers comprising a piezoelectric material and internal electrode layers having electrical conductivity, and an electrically conducting adhesive layer is provided to allow for electrical conduction of the internal electrode layer of the same polarity on the side surface of the ceramic stack, wherein the electrically conducting adhesive layer comprises a base resin having dispersed therein an electrically conducting filler and microparticles, and the boundary between the microparticle and the base resin is in a state that a void is formed at least in a part between those two members or in a state that, when the base resin is elongated, a void can be formed between those two members.

In the stacked piezoelectric element of the present invention, the electrically conducting adhesive layer comprises a resin base having dispersed therein an electrically conducting filler and microparticles.

Also, the boundaries between the microparticles and the base resin is in a state that a void is formed at least in a part between those two members or in a state that when the base resin is elongated, a void can be formed between those two members.

That is, at the driving of the stacked piezoelectric element, the electrically conducting adhesive layer is forming or forms a void between the microparticle and the base resin. By virtue of this void, the electrically conducting agent layer can be improved in elasticity and can readily undergo elastic deformation, so that the stress generated due to displacement of the piezoelectric layer can be satisfactorily relieved and cracking, separation or the like can be prevented from occurring.

In this way, according to the present invention, an excellent electrically conducting adhesive layer as described above is provided and therefore, a stacked piezoelectric element having excellent reliability and durability and capable of maintaining the initial performance over the long-time use can be provided.

The second aspect of the invention is a method for producing a stacked piezoelectric element comprising a ceramic stack obtained by alternately stacking piezoelectric layers comprising a piezoelectric material and internal electrode layers having electrical conductivity, and an electrically conducting adhesive layer provided to allow for electrical conduction of the internal electrode layer of the same polarity on the side surface of the ceramic stack, the method comprising:

a stack forming step of alternately stacking the piezoelectric layers and the internal electrode layers to form the ceramic stack, an adhesive coating step of coating an electrically conducting adhesive on the side surface of the ceramic stack, and a curing step of heating and thereby curing the electrically conducting adhesive to form the electrically conducting adhesive layer, wherein the electrically conducting adhesive comprises a base resin having dispersed therein an electrically conducting filler and microparticles, and the boundaries between the microparticles and the base resin after the curing step is put into a state that a void is formed at least in a part between those two members or into a state that, when the base resin is elongated, a void can be formed between those two members.

In the production method of a stacked piezoelectric element of the present invention, at least the stack forming step, the adhesive coating step and the curing step are performed.

The electrically conducting adhesive comprises the base resin having dispersed therein the electrically conducting filler and the microparticles.

By applying the curing step, the boundary between the microparticles and the base resin is put into a state that a void is formed at least in a part between those two members or into a state that when the base resin is elongated, a void can be formed between those two members.

At the driving of the stacked piezoelectric element obtained through these steps, a void is formed or can be formed between the microparticle and the base resin in the electrically conducting adhesive. By virtue of this void, the electrically conducting agent layer can be improved in elasticity and can readily undergo elastic deformation, so that the stress generated due to displacement of the piezoelectric layer can be satisfactorily relieved and cracking, separation or the like can be prevented from occurring.

In this way, according to the production method of the present invention, a stacked piezoelectric element having excellent reliability and durability and capable of maintaining the initial performance over a long time can be provided.

The third aspect of the invention is an electrically conducting adhesive comprising a base resin having dispersed therein an electrically conducting filler and microparticles, which is constituted such that, after curing of the base resin, the boundaries between the microparticles and the base resin can realize a state where a void is formed at least in a part between those two members, or a state where when the base resin is elongated, a void can be formed between those two members.

The electrically conducting adhesive of the present invention comprises a base resin having dispersed therein an electrically conducting filler and microparticles.

Also, the electrically conducting adhesive of the present invention is constituted such that, after curing of the base resin, the boundaries between the microparticles and the base resin is put into a state where a void is formed at least in a part between those two members, or a state where, when the base resin is elongated, a void can be formed between those two members.

Accordingly, when this electrically conducting adhesive is used by bonding and curing it on an apparatus undergoing displacement during driving, such as a stacked piezoelectric element, a void is formed or can be formed between a microparticle and the base resin. By virtue of this void, the electrically conducting adhesive after curing can be improved in elasticity and can readily undergo elastic deformation, so that the stress generated due to displacement of the piezoelectric layer can be satisfactorily relieved and cracking, separation or the like can be prevented from occurring.

In this way, the electrically conducting adhesive of the present invention can provide, when applied as an electrically conducting material, an apparatus having enhanced reliability and durability and capable of maintaining its initial performance over a long time.

Incidentally, the electrically conducting adhesive of the present invention is applicable not only to the above-described stacked piezoelectric element but also various devices containing an electrically conducting adhesive as a constituent element.

DETAILED DESCRIPTION

In the first aspect of the invention, the piezoelectric layer preferably comprises a lead zirconate titanate which is an oxide of a Pb(Zr, Ti)$O_3$-type perovskite structure. The lead zirconate titanate (PZT) has excellent piezoelectric properties and can give a stacked piezoelectric element having excellent properties. Here, it is also preferred, in view of environmental conservation, to use a lead-free piezoelectric ceramic not containing lead.

As for the internal electrode layer, for example, an Ag/Pd alloy containing, as the alloy component, Ag (silver), Cu (copper), which are a substance having excellent electrical conductivity, Pd (palladium) or the like can be used.

The ceramic stack can take various structures such as partial electrode structure and entire electrode structure, and the cross-sectional shape thereof can also take various forms such as barrel, circle, square, hexagon and octagon.

The boundary between a microparticle and the base resin is preferably in a state that a void is formed at least in a part between those two members. In this case, by previously forming a void between a microparticle and the base resin, the elasticity of the electrically conducting adhesive layer is unfailingly enhanced, so that the stress generated due to dislocation of the piezoelectric layer can be satisfactorily relieved and cracking, separation or the like can be prevented from occurring.

Also, the boundary between a microparticle and the base resin is preferably in a state that those two members are separable from each other. In this case, a void can be formed between those two members when the base resin is elongated, and therefore, the elasticity of the electrically conducting adhesive layer is enhanced, so that the stress generated due to dislocation of the piezoelectric layer can be satisfactorily relieved and cracking, separation or the like can be prevented from occurring.

A microparticle preferably has an average particle diameter of 2 to 30 μm. In this case, the microparticles can be uniformly dispersed in the base resin and therefore, the elasticity of the electrically conducting adhesive layer is more enhanced, so that the stress generated due to dislocation of the piezoelectric layer can be satisfactorily relieved and cracking, separation or the like can be more successfully prevented from occurring.

As for the microparticle, various components can be employed and various constitutions can be used.

For example, the microparticle used may be a crop powder. The crop powder generally has a large water content and therefore, when the electrically conducting adhesive is heated and thereby cured, the water content is evaporated and the crop powder itself shrinks, so that a void can be formed between the microparticle and the base resin.

Also, the crop powder differs in the degree of shrinkage on heating depending on the amount of water contained and therefore, the size of the void between the microparticle and the base resin can be adjusted. In turn, the elasticity of the electrically conducting adhesive layer can be controlled. Furthermore, a low cost can be realized and the use of a natural material is preferred in view of the environment.

Examples of the crop powder include potato starch flour, soybean flour and wheat flour. One of these flours may be used alone or a plurality thereof may be mixed and used.

The microparticle may be constituted such that at least the surface thereof is a non-adhesive surface not adhering to the base resin. In this case, a separable state is obtained between the microparticle with a non-adhesive surface and base resin, so that when the base is elongated, a void can be formed between those two members.

The microparticle with a non-adhesive surface may be constituted to comprise a particle body and an exterior non-adhesive coat layer covering the particle body surface and forming the non-adhesive surface. In this case, a separable state is obtained between the exterior non-adhesive coat layer and the base layer, so that when the base layer is elongated, a void can be formed between the base resin and the microparticle with the exterior non-adhesive coat layer.

The particle body is preferably an elastic body. In this case, when the base resin is elongated, the particle body can be displaced in the elongation direction, so that the elasticity of the electrically conducting adhesive layer can be more enhanced.

The microparticle may be constituted such that an interior non-adhesive coat layer covering the microparticle without adhering to the surface thereof is provided and the interior non-adhesive coat layer is joined and integrated with the base resin. In this case, a separable state is obtained between the microparticle and the interior non-adhesive coat layer, so that when the base resin is elongated, a void can be formed between the microparticle and the interior non-adhesive coat layer which is joined and integrated with the base resin.

The microparticle is preferably an elastic body. In this case, when the base resin is elongated, the microparticle can be displaced in the elongation direction, so that the elasticity of the electrically conducting adhesive layer can be more enhanced.

The stacked piezoelectric element is preferably a piezoelectric actuator, for an injector, which is used as a driving source of the injector.

The injector is used in a severe condition of high-temperature atmosphere and therefore, when the above-described excellent stacked piezoelectric element is used as an actuator, the reliability and durability can be improved and the performance of the injector as a whole can be enhanced.

In the second aspect of the invention, the electrically conducting adhesive used preferably comprises, as the microparticle, a particle capable of shrinking due to heating in the curing step, and the boundary between the microparticle and the base resin after the curing step is preferably put into a state that a void is formed at least in a part between those two members. In this case, the microparticle shrinks due to heating and therefore, a void can be unfailingly formed between the two members.

The size of the void can be adjusted by the degree of shrinkage of the microparticle due to heating, so that the elasticity of the electrically conducting adhesive layer can be controlled.

The electrically conducting adhesive preferably comprises, as the microparticle, a particle with at least the surface thereof having a non-adhesive surface capable of not adhering to the base resin, and the boundary between the microparticle and the base resin after the curing step is preferably put into a state that those two members are separable from each other. In this case, the surface of the microparticle has a non-adhesive surface capable of not adhering to the base resin and therefore, those two members become separable from each other, so that when the base resin is elongated, a void can be unfailingly formed between those two members.

The microparticle used may comprise a particle body and an exterior non-adhesive coat layer covering the particle body surface and forming the non-adhesive surface.

The particle body is preferably an elastic body.

As for the electrically conducting adhesive, it is preferred that the microparticle used comprises an interior non-adhesive coat layer covering the microparticle without adhering to the surface thereof and when the curing step is applied, the interior non-adhesive coat layer is joined and integrated with the base resin and the boundary between the microparticle and the base resin is put into a state where those two members are separable from each other.

The microparticle is preferably an elastic body.

As for the electrically conducting adhesive, it is preferred that the microparticle used comprises a particle body and an evaporative coat layer covering the particle body surface and evaporating due to heating in the curing step and when the curing step is applied, the evaporative coat layer is evaporated and the boundary between the microparticle and the base resin is put into a state that a void is formed at least in a part between those two members. In this case, the evaporative coat layer is evaporated due to heating and therefore, a void can be unfailingly formed between those two members.

Furthermore, the size of the void can be adjusted by the thickness of the evaporative coat layer, so that the elasticity of the electrically conducting adhesive layer can be controlled.

The particle body is preferably an elastic body.

In the third aspect of the invention, the base resin which can be used is, for example, a resin such as an epoxy resin, silicone, a polyimide resin, a phenol resin and a urethane. Furthermore, the electrically conducting filler which can be used is, for example, a substance with excellent electrical conductivity, such as Ag (silver), Pd (palladium), Cu (copper), Au (gold), Pt (platinum) and Ni (nickel). One of these may be used alone or a plurality thereof may be mixed and used.

Also in this invention, the microparticle preferably has an average particle diameter of 2 to 30 μm.

The microparticle used may be a crop powder.

The microparticle may be constituted such that at least the surface thereof is a non-adhesive surface capable of not adhering to said base resin.

Furthermore, the microparticle may be constituted to comprise a particle body and an exterior non-adhesive coat layer covering the particle body surface and forming the non-adhesive surface.

The particle body is preferably an elastic body.

The microparticle may be constituted such that an interior non-adhesive coat layer covering the microparticle without adhering to the surface thereof is provided and the interior non-adhesive coat layer is joined and integrated with the base resin.

The microparticle is preferably an elastic body.

The microparticle may be constituted to comprise a particle body and an evaporative coat layer covering the particle body surface and evaporating due to heating.

The microparticle is preferably an elastic body.

EXAMPLES

Example 1

Figure 1:
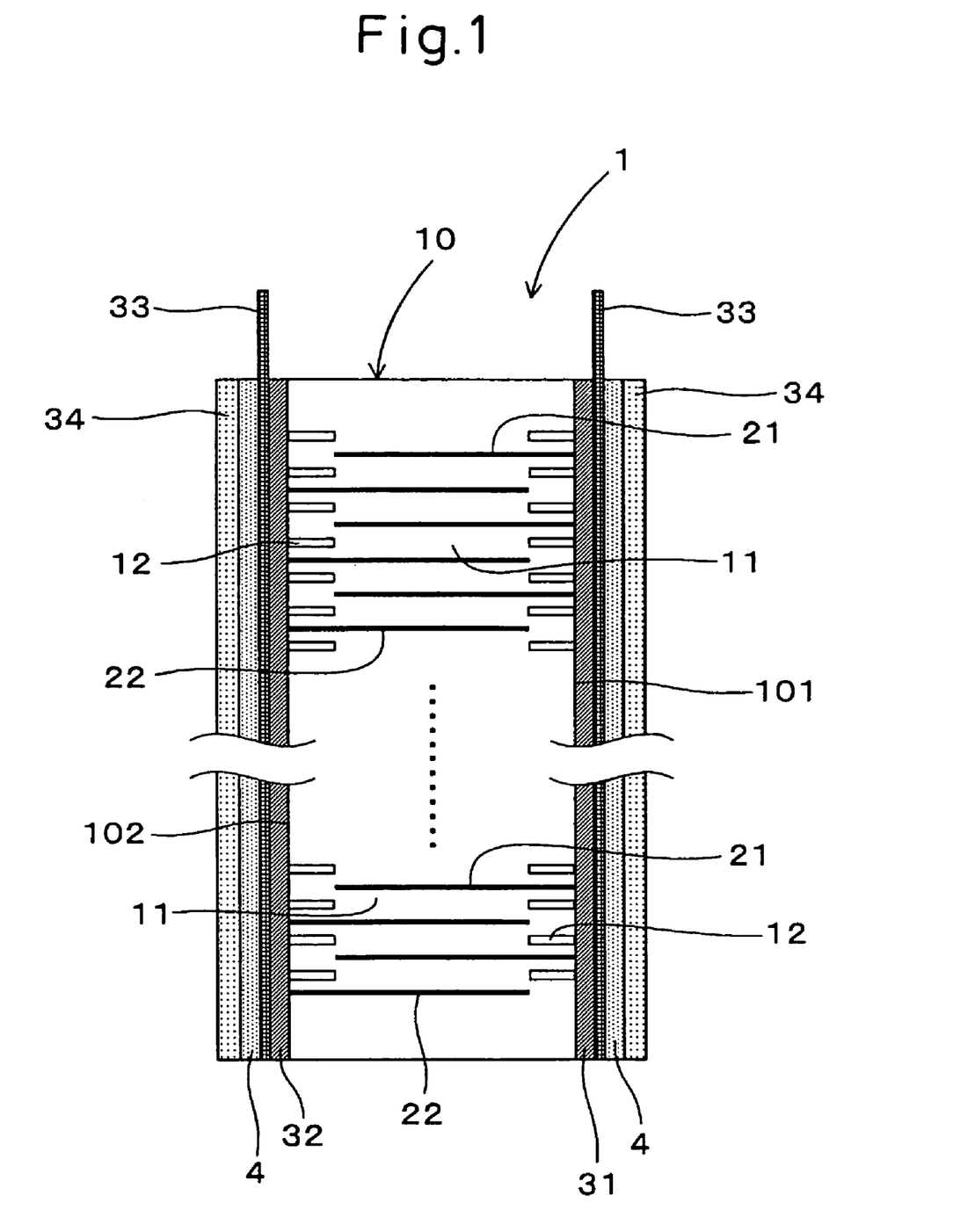
FIG. 1 is an explanatory view showing the structure of the stacked piezoelectric element in Example 1.
Figure 2:
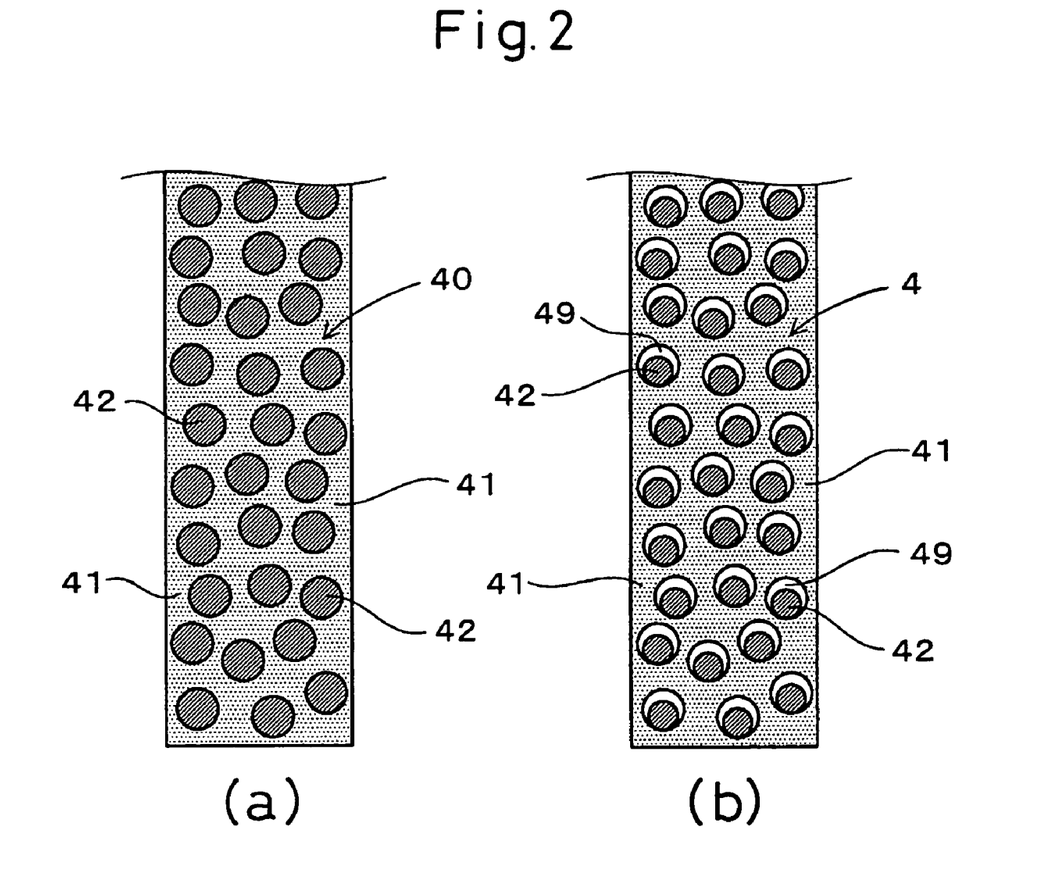
FIG. 2(a) is an explanatory view showing the structure of the electrically conducting adhesive layer before the curing step in Example 1.
FIG. 2(b) is an explanatory view showing the structure of the electrically conducting adhesive layer after the curing step.
Figure 3:
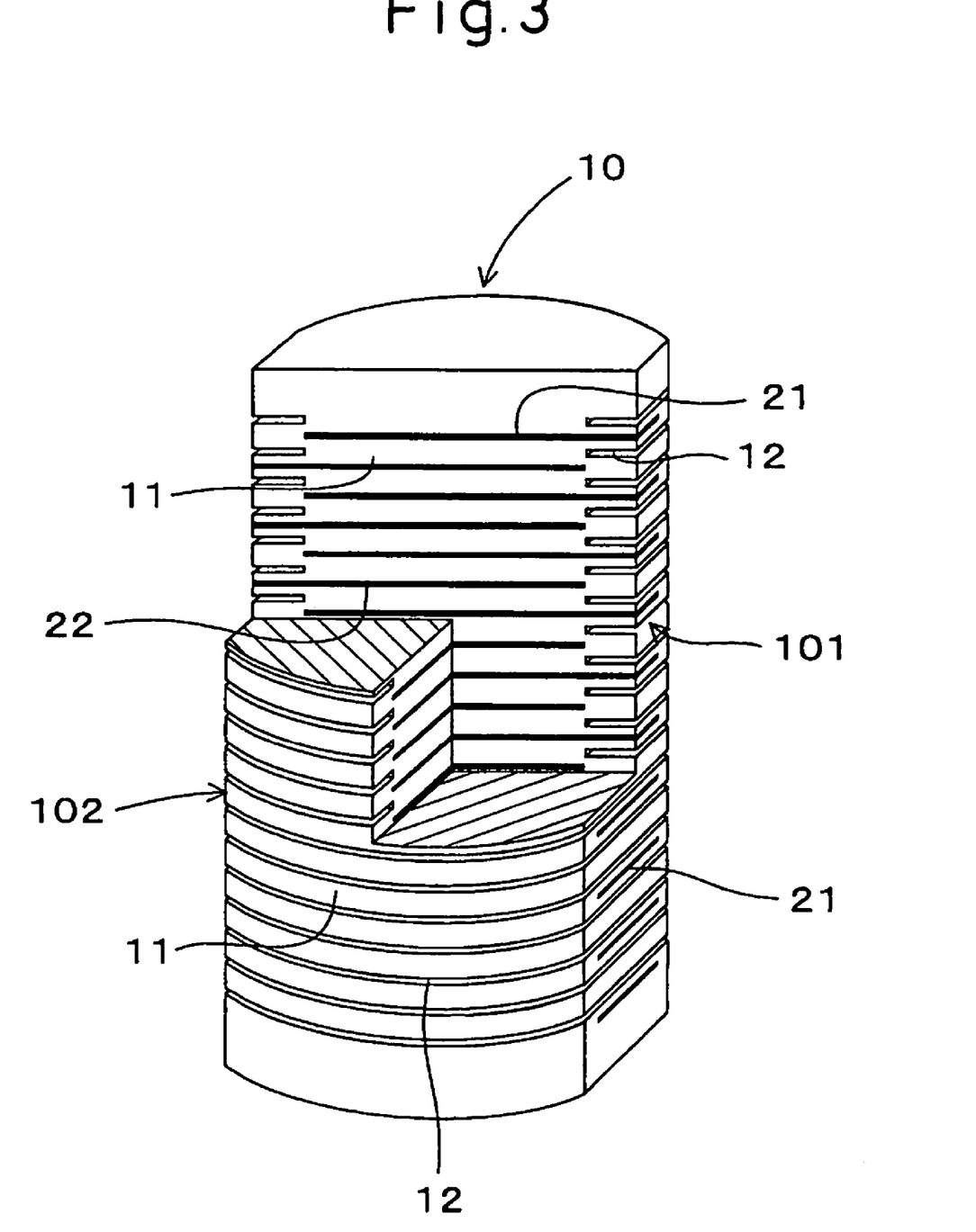
FIG. 3 is an explanatory view showing the structure of the ceramic stack in Example 1.

The stacked piezoelectric element according to Examples of the present invention is described by referring to FIGS. 1 to 3.

The stacked piezoelectric element 1 of the present invention comprises, as shown in FIG. 1, a ceramic stack 10 obtained by alternately stacking a piezoelectric layer 11 comprising a piezoelectric material and an internal electrode layer 21 (22) having electrical conductivity, and an electrically conducting adhesive layer 4 provided to allow for electrical conduction of the internal electrode layer 21 (22) of the same polarity on the side surface of the ceramic stack 10.

The electrically conducting adhesive layer 4 comprises, as shown in FIG. 2(b), a base resin 41 having dispersed therein an electrically conducting filler (not shown) and microparticles 42.

The boundary between the microparticle 42 and the base resin 41 is in a state that a void 49 is formed at least in a part between those two members.

This is described in detail below.

The stacked piezoelectric element 1 of this Example comprises, as shown in FIG. 1, a ceramic stack 10 obtained by alternately stacking a piezoelectric layer 11 comprising a piezoelectric material and an internal electrode layer 21 (22) having electrical conductivity On the side surface 101 of the ceramic stack 10, the end part of the first internal electrode layer 21 is exposed and the end part of the second internal electrode layer 22 is not exposed but stays inside, whereas on the side surface 102, the end part of the second internal electrode layer 22 is exposed and the end part of the first internal electrode layer 21 is not exposed but stays inside. That is, in view of structure, the ceramic stack 10 of this Example employs a partial electrode structure.

Also, the ceramic stack 10 has, as shown in FIG. 3, a slit layer 12 in the intermediate part in the stacking direction of adjacent internal electrode layers 21 and 22. This slit layer 12 forms a slit-like gap over the entire circumference in the outer peripheral part of the ceramic stack 10. In this Example, a slit layer 12 having a thickness of about 6 μm is formed for the piezoelectric layer 11 having a thickness of 80 μm.

By the formation of this slit layer 12, the ceramic stack 10 of this Example can realize substantially the same actuation as effected with an entire electrode structure, though its structure is a partial electrode structure as described above.

As shown in FIG. 1, metal layers 31 and 32 are provided on side surfaces 101 and 102, respectively, of the ceramic stack 10. The metal layer 31 is electrically connected to the first internal electrode layer 21, and the metal layer 32 is electrically connected to the second electrode layer 22.

On the metal layer 31 (32), an electrically conducting adhesive layer 4 formed of an electrically conducting adhesive 40 is provided, and a take-out electrode 33 is joined through this electrically conducting adhesive layer 4. It is also possible to take a structure that without providing the metal layer 31 (32), the take-out electrode 33 is directly joined to the side surface 101 (102) of the ceramic stack 10 through the electrically conducting adhesive layer 4.

Here, the electrically conducting adhesive layer 4 comprises, as shown in FIG. 2(b), a base resin 41 having dispersed therein an electrically conducting filler and microparticles 42. The boundary between the microparticle 42 and the base resin 41 is in a state that a void 49 is formed at least in a part between those two members.

Furthermore, as shown in FIG. 1, the entire circumference on the side surface of the ceramic stack 10 is molded with a molding material 34 comprising silicone resin which is an insulating resin. As for this molding material 34, a molding material having a viscosity of not allowing for intrusion into the inside of the slit layer 12 is used, whereby the slit layer 12 maintains the state that a slit-like gap is formed.

In this Example, the internal electrode layers 21 and 22 and the metal layers 31 and 32 each comprises an Ag (silver)/Pd (palladium) alloy having electrical conductivity.

For the take-out electrode 33, a mesh-like expander metal obtained working a metal plate is used. Other than this, a punched metal or the like may also be used. The position to which the take-out electrode 33 is joined may be only the upper part on the side surface of the ceramic stack 10.

The electrically conducting adhesive 40 used for the production of the stacked piezoelectric element 1 is described below by referring to FIG. 2.

The electrically conducting adhesive 40 of this Example comprises, as shown in FIG. 2(a), a base resin 41 having dispersed therein an electrically filler and microparticles 42.

The electrically conducting adhesive is constituted such that after curing of the base resin 41, the boundary between the microparticle 42 and the base resin 41 can realize, as shown in FIG. 2(b), a state where a void 49 is formed at least in a part between those two members.

In this Example, an epoxy resin is used as the base resin 41 forming the electrically conducting adhesive 40, and Ag (silver) is used as the electrically conducting filler.

Also, a crop powder, which is a particle capable of shrinking due to heating at the time of curing the base resin 41 is used as the microparticle 42. The crop powder of this Example is obtained by heating a potato starch flour to adjust the water content and then finely processing the resulting powder. The average particle diameter is about 15 μm.

The crop powder has a large water content and therefore, the water content is evaporated due to heating at the time of curing the base resin 41 and the crop powder itself is shrunk. Therefore, the electrically conducting adhesive 40 of this Example is constituted to provide a state, after curing of the base resin 41, that a void 49 is formed between the microparticle (crop powder) 42 and the base resin 41.

In this example, the potato starch flour is used as the crop powder, but a soybean flour, a wheat flour and the like may be used alone or a plurality of these flours may be mixed and used. Furthermore, other than the crop powder, for example, an activated carbon capable of shrinking due to heating or a particle obtained by adsorbing an evaporative substance to an adsorptive resin may also be used a the microparticle 42.

The production method of the stacked piezoelectric element 1 is described below by referring to FIGS. 4 to 6.

In producing the stacked piezoelectric element 1 of this Example, at least a stack forming step of alternately stacking a piezoelectric layer 11 and an internal electrode layer 21 (22) to form a ceramic stack 10, an adhesive coating step of coating an electrically conducting adhesive 40 on the side surface of the ceramic stack 10, and a curing step of heating and thereby curing the electrically conducting adhesive 40 to form an electrically conducting adhesive layer 4, are performed.

As for the electrically conducting adhesive 40, the above-described base resin 41 having dispersed therein an electrically conducting filler and microparticles 42 is used.

After the curing step, the boundary between the microparticle 42 and the base resin 41 is put into a state that a void 49 is formed at least in a part between those two members.

This is described in detail below.

First, in the stack forming step, a lead zirconate titanate (PZT) powder working out to a piezoelectric material was prepared and temporarily fired at 850° C. Thereafter, pure water and a dispersant were added to the temporarily fired powder to form a slurry, and the slurry was wet-ground by a pearl mill. The ground product was dried, powder-degreased and after adding thereto a solvent, a binder, a plasticizer, a dispersant and the like, mixed in a ball mill. The resulting slurry was vacuum-defoamed while stirring with a stirrer in a vacuum device, to thereby adjust the viscosity.

Figure 4:
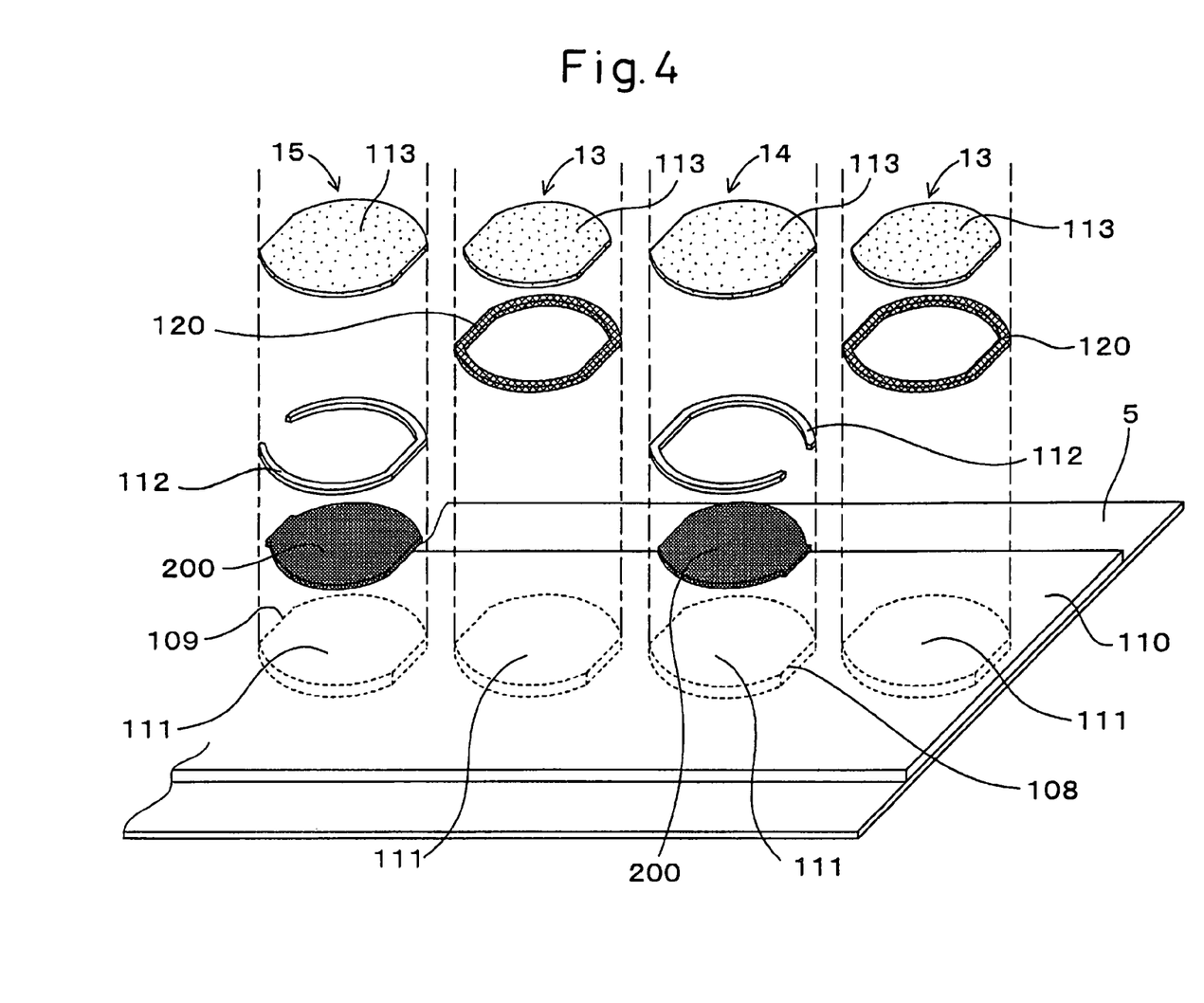
FIG. 4 is an explanatory view showing the process of applying printing on a green sheet in Example 1.

This slurry was then, as shown in FIG. 4, coated on a carrier film 5 by a doctor blade method to shape a green sheet 110 having a thickness of about 100 μm. As for the method of shaping a green sheet 110 from the slurry, an extrusion molding method and other various methods can also be used.

Then, as shown in FIG. 4, in order to produce three kinds of sheet pieces 13, 14 and 15, various material were printed on a barrel-shaped punching layer 111 which is a punching portion of the green sheet 110. In this Example, as shown in FIG. 4, a combination of sheet pieces in the stacking order, that is, sheet pieces 13, 14, 13 and 15, was taken as one unit, and this unit was repeatedly printed.

For the sheet piece 13, as shown in FIG. 4, a dissipating material 120 which disappears after firing to form a slit layer 12 was screen-printed over the entire circumference in the outer peripheral part of the punching layer 111. In the inner peripheral part on the punching layer 111, an adhesive layer 113 comprising the slurry prepared above was screen-printed so as to come nearly flush with the printing height of the outer peripheral part having printed thereon the dissipating material 120 and enhance the adhesion effect on stacking.

For the sheet piece 14, as shown in FIG. 4, an electrode material 200 which forms an internal electrode layer 21 (22) by the firing was screen-printed in the inner peripheral part on the punching layer 111 and in the outer peripheral part formed by a linear side surface 108. In the portion where the electrode material was not printed, a spacer layer 112 comprising the slurry prepared above was screen-printed so as to come nearly flush with the printing height of the printed portion. Furthermore, over the entire surface thereon, an adhesive layer 113 comprising the slurry prepared above was screen-printed.

For the sheet piece 15, as shown in FIG. 4, an electrode material 200 was screen-printed in the inner peripheral part on the punching layer 111 and in the outer peripheral part formed by a linear side surface 109, and a spacer layer 112 and an adhesive layer 113 each was screen-printed in the same manner as in the sheet piece 14.

In this Example, a carbon particle of less undergoing thermal deformation and capable of maintaining the shape of the slit layer 12 with high precision was used as the dissipating material 120. Other than this, a resin particle, a crop particle or the like can be used.

As for the electrode material 200, an Ag/Pd alloy paste was used.

Thereafter, punching and stacking were performed in parallel by using a punching/stacking apparatus made up to allow for simultaneous proceeding of punching and stacking of the punching layer 111 subjected to the above-described printing.

Figure 5:
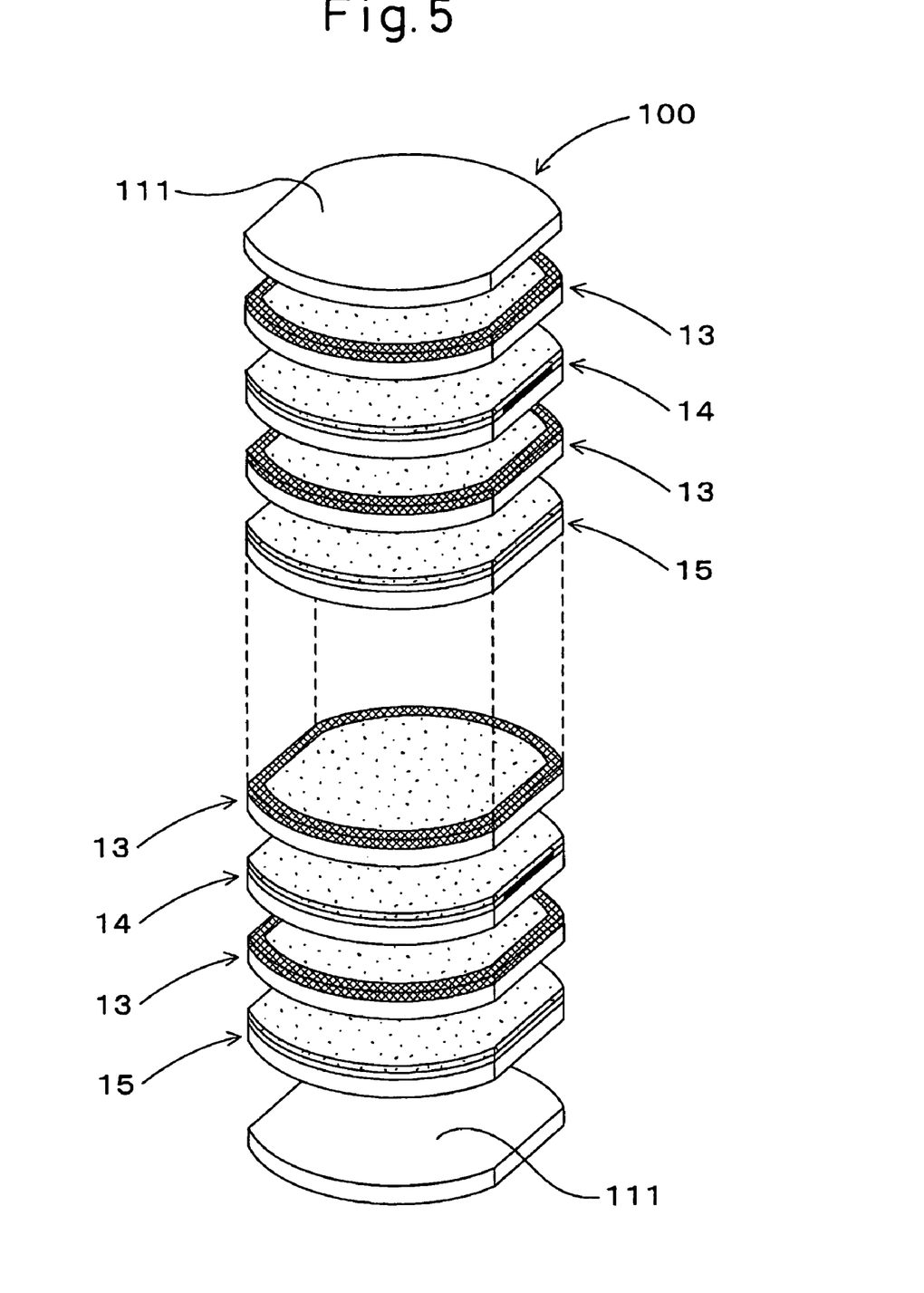
FIG. 5 is an explanatory view showing the process of stacking sheet pieces in Example 1.
Figure 6:
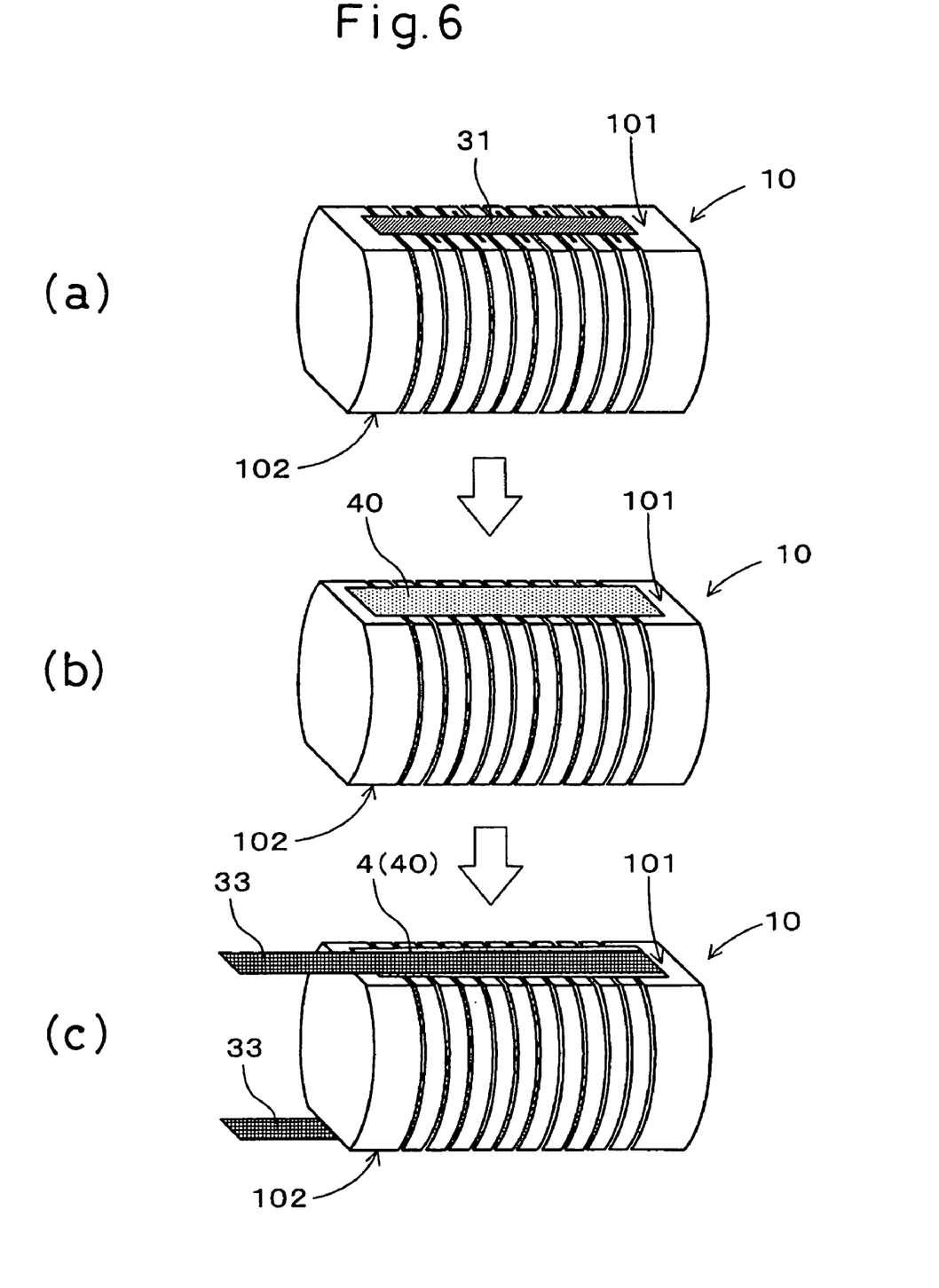
FIG. 6 is an explanatory view showing the process of disposing the metal layer, the electrically conducting adhesive layer and the take-out electrode on the ceramic stack in Example 1.

The carrier film 5 and the green sheet 110 in the integrated state were set in the above-described punching/stacking apparatus and, while punching out the punching layer 111, was subjected to the printing in the stacking order of sheet pieces, as shown in FIG. 5, by taking a combination of sheet pieces 13, 14, 13 and 15 as one unit, the unit was repeatedly stacked to produce a stack 100. On the top and bottom in the stacking direction of the produced stack 100, only the punching layer 111 was disposed as a dummy layer.

Thereafter, a load of about 500 g/cm$^2$ was applied on the stack 100 from the stacking direction and this state was held for 1 hour or more. On the side surface of the stack 100, an Ag/Pd alloy paste which forms a metal layer 31 (32) by the firing was coated and fired at 1,050° C., thereby obtaining a ceramic stack 10 in which, as shown in FIG. 6(a), metal layers 31 and 32 were provided on the side surfaces 101 and 102, respectively.

In the ceramic stack 10, resulting from disappearance of the dissipating material 120 in the firing, a slit layer 12 was provided in the intermediate part in the stacking direction of adjacent internal electrode layers 21 and 22, and a slit-like gap was formed over the entire circumference in the outer peripheral part of the ceramic stack 10.

Next, in the adhesive coating step, as shown in FIG. 6(b), an electrically conducting adhesive 40 was coated by screen-printing on the metal layer 31 (32) provided on the side surface 101 (102) of the ceramic stack 10.

Then, in the curing step, as shown in FIG. (c), a take-out electrode 33 was disposed on the electrically conducting adhesive 40 and cured by heating it at 150° C. for 30 minutes, thereby forming an electrically conducting adhesive layer 4 and joining the take-out electrode 33.

Finally, the entire circumference on the side surface of the ceramic stack 10 was molded with a molding material 34 to complete the stacked piezoelectric element 1.

The operational effect of the stacked piezoelectric element 1 of this Example is described below.

The stacked piezoelectric element 1 of this Example comprises, as described above, a ceramic stack 10 obtained by alternately stacking a piezoelectric layer 11 comprising a piezoelectric material and an internal electrode layer 21 (22) having electrical conductivity, and an electrically conducting adhesive layer 4 provided to allow for electrical conduction of the internal electrode layer 21 (22) of the same polarity on the side surface of the ceramic stack 10.

The electrically conducting adhesive layer 4 comprises a base resin 41 having dispersed therein an electrically conducting filler and microparticles 42.

The boundary between the microparticle 42 and the base resin 41 is in a state that a void 49 is formed at least in a part between those two members.

The electrically conducting adhesive layer is formed by heating and thereby curing an electrically conducting adhesive 40 comprising a base resin 41 having dispersed therein an electrically conducting filler and microparticles 42. In this Example, a crop particle which is a particle of shrinking due to heating is used as the microparticle 42.

Therefore, although the electrically conducting adhesive 40 before the curing step is in a state that, as shown in FIG. 2(a), microparticles 42 are dispersed in the base resin 41 without forming a void, the electrically conducting adhesive layer 4 after the curing step is in a state that, as shown in FIG. 2(b), the microparticle 42 is shrunk due to heating and a void 49 is formed between the microparticle and the base resin 41.

By virtue of the void 49 between the microparticle 42 and the base resin 41, the electrically conducting agent layer 4 provided in the stacked piezoelectric element 1 can be improved in elasticity and can readily undergo elastic deformation, so that the stress generated due to displacement of the piezoelectric layer 11 can be satisfactorily relieved and cracking, separation or the like can be prevented from occurring.

In this way, according to this Example, a stacked piezoelectric element 1 having excellent reliability and durability and capable of maintaining the initial performance over the long-time use can be obtained.

In this Example, a crop powder is used as the microparticle. The crop powder differs in the degree of shrinkage at the heating depending on the amount of water contained and therefore, the size of the void 49 between the microparticle 42 and the base resin 41 can be adjusted. In turn, the elasticity of the electrically conducting adhesive layer 4 can be controlled.

In the ceramic stack 10, a slit layer 12 is provided in the intermediate part in the stacking direction of adjacent internal electrode layers 21 and 22. By virtue of this slit layer 12, the stress generated due to displacement of the dielectric layer 11 can be more relieved. Incidentally, the slit layer 12 may also be provide in the intermediate part in the stacking direction of internal electrode layers 21 (22) every other layer or every multiple layers. A structure where the slit layer 12 is not provided may also be employed.

In this Example, the ceramic stack 10 is produced by employing a method of stacking layers in the green sheet state and integrally firing the sheets but instead, other methods such as a method of firing a piezoelectric unit and bonding the units by an adhesive to form a stack may also be used.

Furthermore, in the ceramic stack 10, a special partial electrode structure having the above-described slit is employed, but a conventionally known normal partial electrode structure having no slit layer or a conventionally known normal entire electrode structure may also be employed.

In addition, the ceramic stack 10 here has a barrel-shaped cross-section, but the cross-sectional shape thereof may take various forms such as circle, square, hexagon and octagon.

Example 2

This Example is a case where, in the stacked piezoelectric element 1 of Example 1, the electrically conducting adhesive 40 contains, as the microparticle 42, a particle with at least the surface thereof having a non-adhesive surface 429 capable of not adhering to said base resin 41.

In this Example, silicone was used as the microparticle 42. Other than silicone, for example, Teflon (registered trademark) may be used.

Others were the same as in Example 1.

In this Example, an electrically conducting adhesive containing, as the microparticle 42, a particle with at least the surface thereof having a non-adhesive surface 429 capable of not adhering to said base resin 41 was used.

Figure 7:
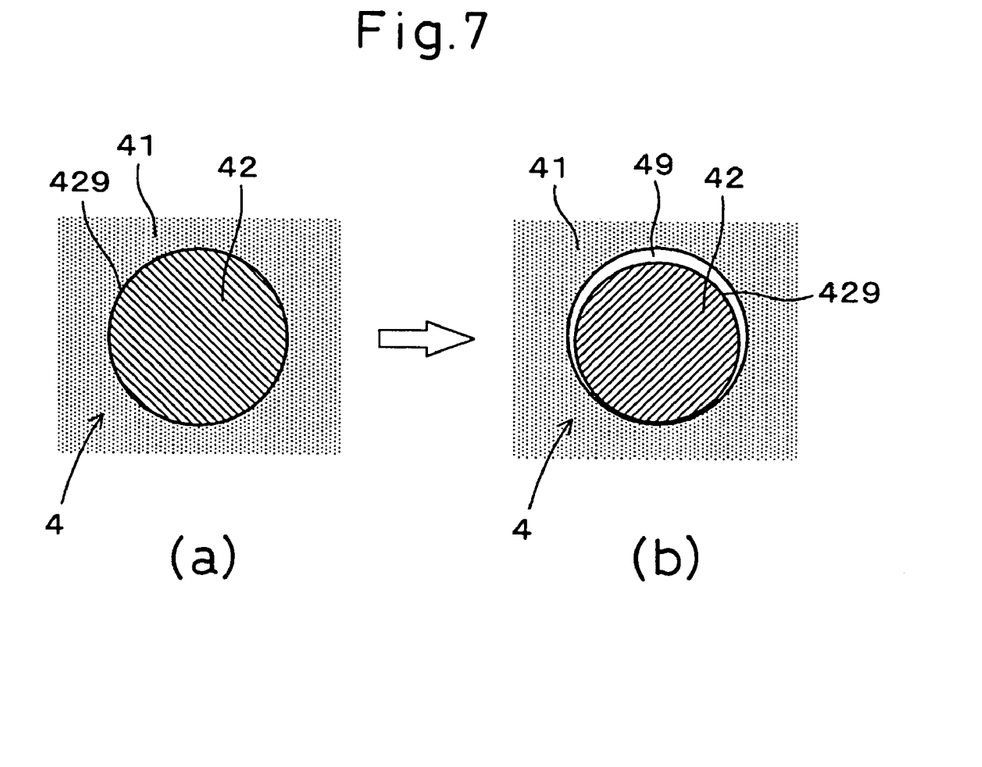
FIG. 7(a) is an explanatory view showing the structure of the electrically conducting adhesive layer after the curing step in Example 2.
FIG. 7(b) is an explanatory view showing the structure of the electrically conducting adhesive layer when the base resin is elongated.

In the electrically conducting adhesive layer 4, after the curing step, as shown in FIG. 7(a), as the surface of the microparticle 42 has a non-adhesive surface 429 capable of not adhering to the base resin 41, the microparticle 42 does not adhere to the base resin 41 and these two members are separable from each other.

Therefore, when the stacked piezoelectric element 1 is driven, that is, when the base resin 41 is elongated, in the electrically conducting adhesive layer 4, as shown in FIG. 7(b), the microparticle 42 and the base resin 41 are separated and a void 49 is formed between these two members.

As for others, the stacked piezoelectric element of this Example has the same operational effect as that of Example 1.

Example 3

Figure 8:
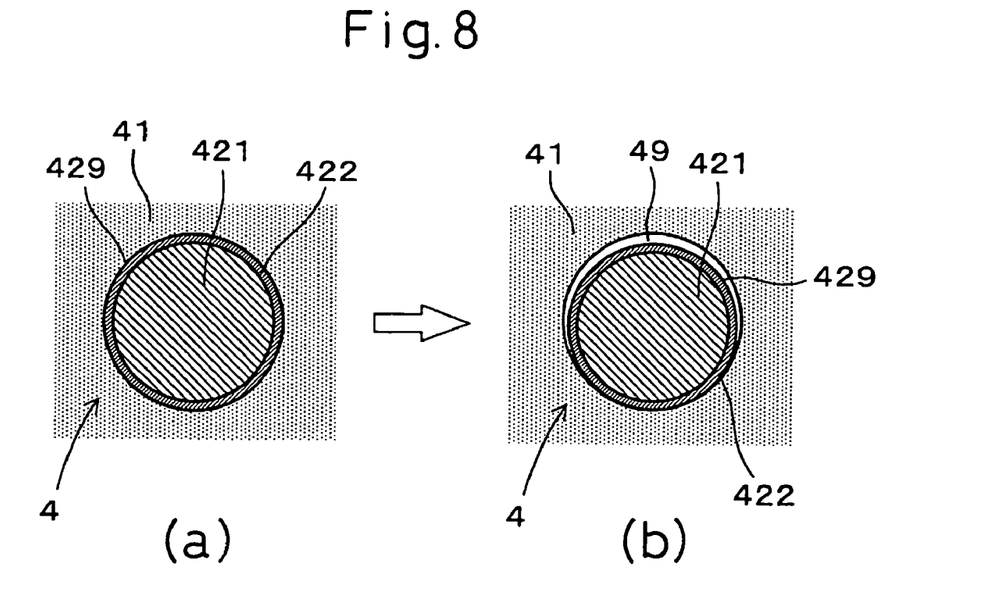
FIG. 8(a) is an explanatory view showing the structure of the electrically conducting adhesive layer after the curing step in Example 3.
FIG. 8(b) is an explanatory view showing the structure of the electrically conducting adhesive layer when the base resin is elongated.

This Example is a case where, in the stacked piezoelectric element 1 of Example 1, as shown in FIG. 8, the electrically conducting adhesive 40 uses, as the microparticle 42, a particle comprising a particle body 421 and an exterior non-adhesive coat layer 422 covering the particle body surface and forming the non-adhesive surface 429.

In this Example, a resin particle was used as the particle body 421 of the microparticle 42. Other than this, for example, a ceramic particle or a glass particle may be used.

Also, silicone was used as the exterior non-adhesive coat layer 422. Other than silicone, for example, Teflon (registered trademark) may be used.

Others were the same as in Example 1.

In this Example, a particle comprising a particle body 421 and an exterior non-adhesive coat layer 422 covering the particle body surface and forming the non-adhesive surface 429 was used as the microparticle 42.

Therefore, in the electrically conducting adhesive layer 4 after the curing step, as shown in FIG. 8(a), the exterior non-adhesive coat layer 422 covering the surface of the particle body and forming the non-adhesive surface 429 does not adhere to the base resin 41, and these two members are in a separable state from each other.

Therefore, when the stacked piezoelectric element 1 is driven, that is, when the base resin 41 is elongated, in the electrically conducting adhesive layer 4, as shown in FIG. 8(*b*), the exterior non-adhesive coat layer 422 and the base resin 41 are separated and a void 49 is formed between these two members.

As for others, the stacked piezoelectric element of this Example has the same operational effect as that of Example 1.

Example 4

Figure 9:
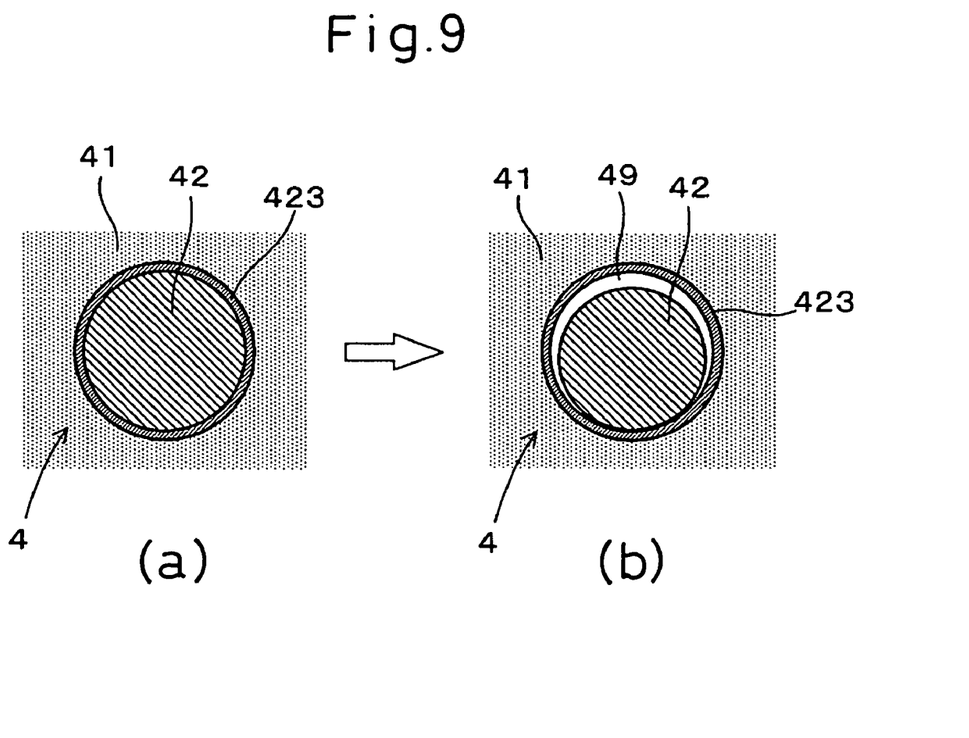
FIG. 9(a) is an explanatory view showing the structure of the electrically conducting adhesive layer after the curing step in Example 4.
FIG. 9(b) is an explanatory view showing the structure of the electrically conducting adhesive layer when the base resin is elongated.

This Example is a case where in the stacked piezoelectric element 1 of Example 1, as shown in FIG. 9, the electrically conducting adhesive 40 uses, as the microparticle 42, a particle comprising an interior non-adhesive coat layer covering the microparticle 42 without adhering to the surface thereof.

In this Example, silicone was used as the microparticle 42. Other than silicone, for example, Teflon (registered trademark) may be used.

Also, epoxy resin was used as the interior non-adhesive coat layer 423. Other than epoxy resin, for example, polyimide resin may be used.

Others were the same as in Example 1.

In this Example, a particle comprising an interior non-adhesive coat layer 423 covering the microparticle 42 without adhering to the surface thereof was used as the microparticle 42.

Therefore, in the electrically conducting adhesive layer 4, after the curing step, as shown in FIG. 9(*a*), the interior non-adhesive coat layer 423 does not adhere to the surface of the microparticle 42 and is joined and integrated with the base resin 41. That is, the microparticle 42 and the interior non-adhesive coat layer 423 are separable from each other.

Therefore, when the stacked piezoelectric element 1 is driven, that is, when the base resin 41 is elongated, in the electrically conducting adhesive layer 4, as shown in FIG. 9(*b*), the microparticle 42 and the interior non-adhesive coat layer 423 are separated and a void 49 is formed between these two members.

As for other effect, the stacked piezoelectric element of this Example has the same operational effect as that of Example 1.

Example 5

Figure 10:
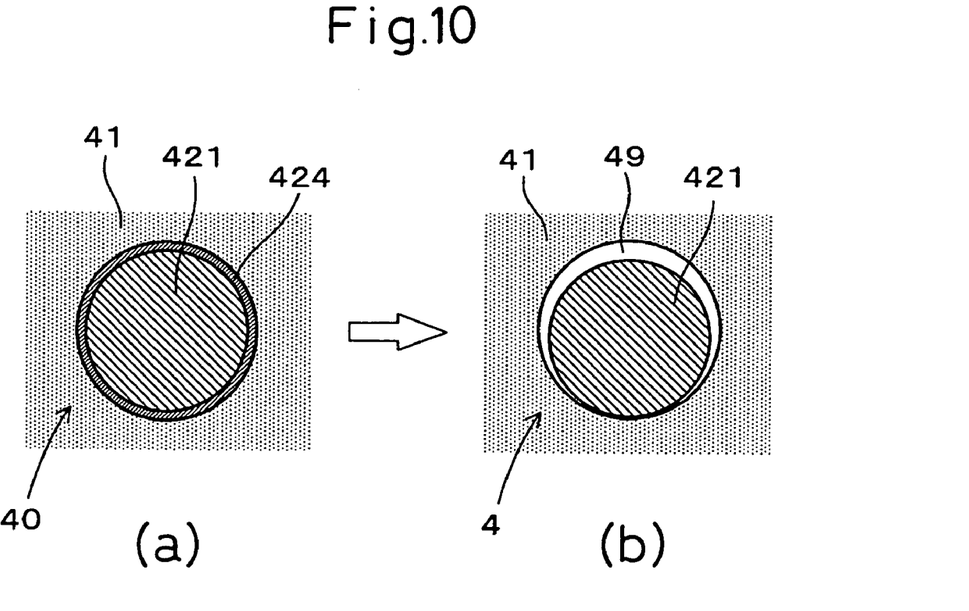
FIG. 10(a) is an explanatory view showing the structure of the electrically conducting adhesive layer after the curing step in Example 5.
FIG. 10(b) is an explanatory view showing the structure of the electrically conducting adhesive layer after the curing step.

This Example is a case where, in the stacked piezoelectric element 1 of Example 1, as shown in FIG. 10, the electrically conducting adhesive 40 uses, as the microparticle 42, a particle comprising a particle body 421 and an evaporative coat layer 424 covering the particle body surface and evaporating due to heating in the curing step.

In this Example, a slightly carbonized crop particle was used as the particle body 421. Other than this, for example, an activated carbon particle may be used.

Also, as the evaporative coat layer 424, a terpineol was coated on the surface. Other than this, for example, a fat or oil which does not dissolve in the electrically conducting adhesive may be used.

Other components were the same as in Example 1.

In this Example, a particle comprising a particle body 421 and an evaporative coat layer 424 covering the particle body surface and evaporating due to heating in the curing step was used as the microparticle 42.

Therefore, although in the electrically conducting adhesive 40 before the curing step, as shown in FIG. 10(*a*), the surface of the particle body 421 is covered by the evaporative coat layer 424, the electrically conducting adhesive layer 4 after the curing step is in a state where, as shown in FIG. 10(*b*), the evaporative coat layer 424 is evaporated due to heating and a void 49 is formed between the particle body 421 and the base resin 41.

As for other elements, the stacked piezoelectric element of this Example has the same operational effect as that of Example 1.

Example 6

This Example is a case where the stacked piezoelectric element 1 of Example 1 is used as the piezoelectric actuator of an injector 6.

Figure 11:
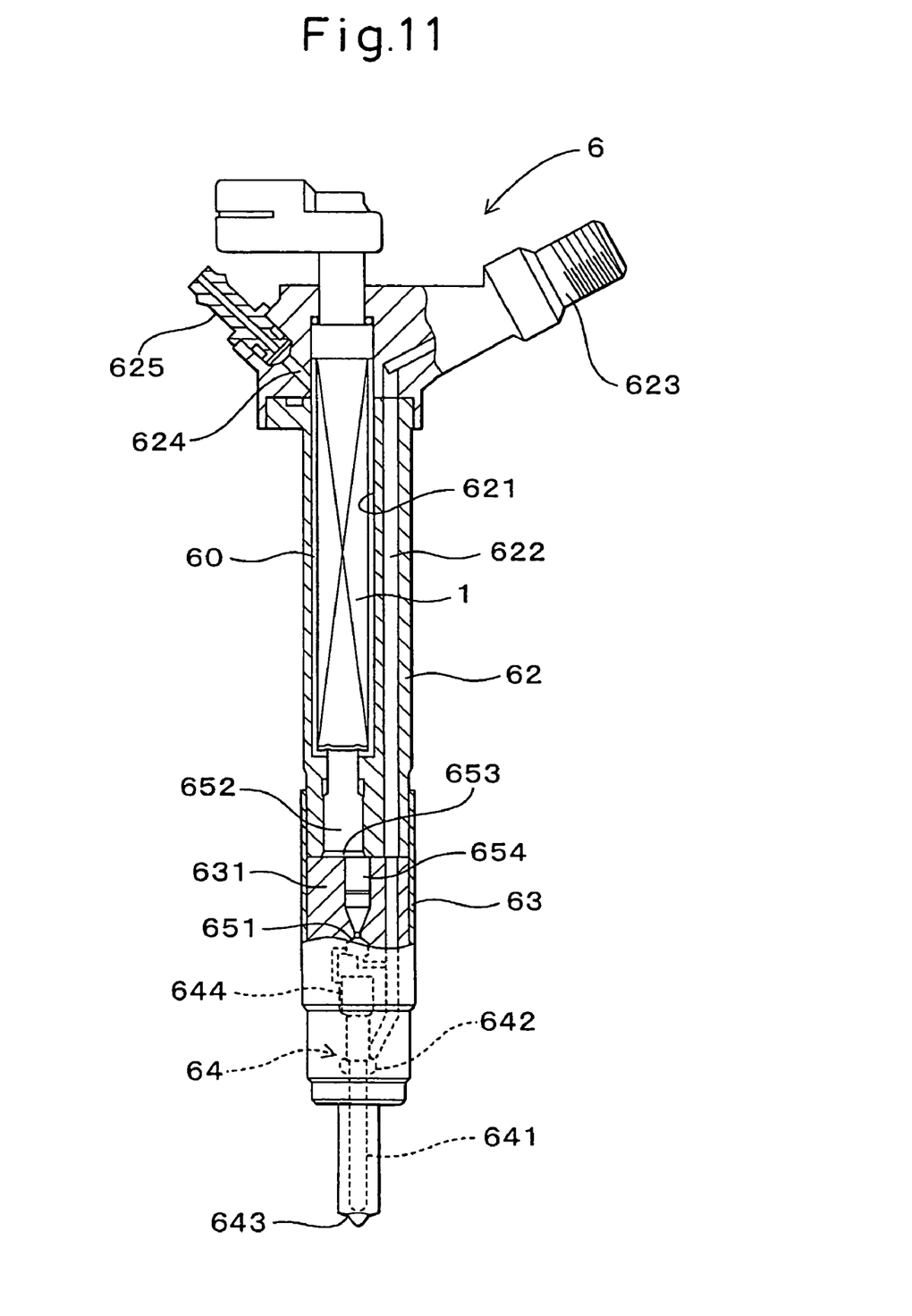
FIG. 11 is an explanatory view showing the structure of the injector in Example 6.

The injector 6 of this Example is, as shown in FIG. 11, applied to a common rail injection system of a diesel engine.

As shown in FIG. 11, this injector 6 comprises an upper housing 62 for housing the stacked piezoelectric element 1 as a driving part, and a lower housing 63 being fixed to the lower end of the upper housing and having formed therein an injection nozzle part 64.

The upper housing 62 is substantially cylindrical and the unit-type stacked piezoelectric element 1 is fitted into and fixed in a longitudinal hole 621 which is eccentric to the center axis.

A high-pressure fuel passage 622 is disposed on the lateral side of the longitudinal hole 621 to run in parallel, and its upper end part communicates with an external common rail (not shown) through a fuel introduction pipe 623 protruding upward from the upper housing 62.

Also, a fuel lead-out pipe 625 communicating with a drain passage 624 is protruded from the upper part of the upper housing 62, and the fuel flowing out from the fuel lead-out pipe 625 is returned to a fuel tank (not shown).

The drain passage 624 communicates with a three-way valve 651 described later through a gap 60 between the longitudinal hole 621 and the driving part (piezoelectric element) 1 and further through a passage (not shown) extending downward from this gap 60 in the upper and lower housings 62 and 63.

The injection nozzle part 64 comprises a nozzle needle 641 which slides up or down in a piston body 631, and an injection hole 643 which is opened or closed by the nozzle needle 641 and injects the high-pressure fuel supplied from a fuel reservoir 642 into each cylinder of an engine. The fuel reservoir 642 is formed around an intermediate part of the nozzle needle 641, and the lower end part of the high-pressure fuel passage 622 opens to this fuel reservoir. The nozzle needle 641 receives a fuel pressure in the valve opening direction from the fuel reservoir 642 and receives a fuel pressure in the valve closing direction from a backpressure chamber 644 provided to oppose the upper end face. When the pressure of the backpressure chamber 644 drops, the nozzle needle 641 is lifted and, as a result, the injection hole 643 is opened and the fuel is injected.

The pressure of the backpressure chamber 644 is increased or decreased by the three-way valve 651. The three-way valve 651 is constituted such that the backpressure chamber 644 selectively communicates with the high-pressure fuel passage 622 or the drain passage 624. Here, a ball-like valve body which opens or closes a port communicating with the high-pressure fuel passage 622 or the drain passage 624 is used. This valve body is driven by the above-described driving part 1 through a large diameter piston 652, an oil pressure chamber 653 and a small diameter piston 654 which are disposed below the driving part.

In this Example, the stacked piezoelectric element 1 of Example 1 is used as the driving source in the injector 6 having such a constitution. As described above, this stacked piezoelectric element 1 has excellent reliability and durability and is capable of maintaining the initial performance over a long time and, therefore, the entire injector 6 can be enhanced in the performance, reliability and durability.

What is claimed is:

1. A stacked piezoelectric element comprising a ceramic stack obtained by alternately stacking a piezoelectric layer comprising a piezoelectric material and an internal electrode layer having electrical conductivity, and an electrically conducting adhesive layer is provided to allow for electrical conduction of said internal electrode layer of the same polarity on the side surface of said ceramic stack,
wherein said electrically conducting adhesive layer comprises a base resin having dispersed therein an electrically conducting filler and microparticles, and
the boundary between said microparticle and said base resin is in a state that a void is formed at least in a part between those two members or in a state that, when said base resin is elongated, a void can be formed between those two members.

2. The stacked piezoelectric element as claimed in claim 1, wherein the boundary between said microparticle and said base resin is in a state that a void is formed at least in a part between those two members.

3. The stacked piezoelectric element as claimed in claim 1, wherein the boundary between said microparticle and said base resin is in a state that those two members are separable from each other.

4. The stacked piezoelectric element as claimed in claim 1, wherein said microparticle has an average particle diameter of 2 to 30 µm.

5. The stacked piezoelectric element as claimed in claim 1, wherein said microparticle is a crop powder.

6. The stacked piezoelectric element as claimed in claim 1, wherein in said microparticle, at least on the surface thereof, has a non-adhesive surface not adhering to said base resin.

7. The stacked piezoelectric element as claimed in claim 6, wherein said microparticle comprises a particle body and an exterior non-adhesive coat layer covering the particle body surface and forming said non-adhesive surface.

8. The stacked piezoelectric element as claimed in claim 7, wherein said particle body is an elastic body.

9. The stacked piezoelectric element as claimed in claim 1, wherein said microparticle comprises an interior non-adhesive coat layer covering said microparticle without adhering to the surface thereof, and said interior non-adhesive coat layer is joined and integrated with said base resin.

10. The stacked piezoelectric element as claimed in claim 9, wherein said microparticle is an elastic body.

11. The stacked piezoelectric element as claimed in claim 1, wherein said stacked piezoelectric element is a piezoelectric actuator for an injector and is used as a driving source for an injector.

12. An electrically conducting adhesive comprising a base resin, having dispersed therein an electrically conducting filler and microparticles,
which is constituted such that after curing of said base resin, the boundary between said microparticle and said base resin can realize a state where a void is formed at least in a part between those two members, or a state where when said base resin is elongated, a void can be formed between those two members.

13. The electrically conducting adhesive as claimed in claim 12, wherein said microparticle has an average particle diameter of 2 to 30 µm.

14. The electrically conducting adhesive as claimed in claim 12, wherein said microparticle is a crop powder.

15. The electrically conducting adhesive as claimed in claim 12, wherein in said microparticle, at least at the surface thereof, is a non-adhesive surface capable of not adhering to said base resin.

16. The electrically conducting adhesive as claimed in claim 15, wherein said microparticle comprises a particle body and an exterior non-adhesive coat layer covering the particle body surface and forming said non-adhesive surface.

17. The electrically conducting adhesive as claimed in claim 16, wherein said particle body is an elastic body.

18. The electrically conducting adhesive as claimed in claim 12, wherein said microparticle comprises an interior non-adhesive coat layer covering said microparticle without adhering to the surface thereof, and said interior non-adhesive coat layer is joined and integrated with said base resin.

19. The electrically conducting adhesive as claimed in claim 18, wherein said microparticle is an elastic body.

20. The electrically conducting adhesive as claimed in claim 12, wherein said microparticle comprises a particle body and an evaporative coat layer covering the particle body surface and capable of evaporating due to heating.

21. The electrically conducting adhesive claimed in claim 20, wherein said particle body is an elastic body.

* * * * *